(12) United States Patent
Mizunaga (10) Patent No.: US 6,281,754 B1
(45) Date of Patent: Aug. 28, 2001

(54) AMPLIFIER CIRCUIT

(75) Inventor: Sunao Mizunaga, Tokyo (JP)

(73) Assignee: Oki Electric Industry Co., Ltd., Tokyo (JP)

(*) Notice: Subject to any disclaimer, the term of this patent is extended or adjusted under 35 U.S.C. 154(b) by 0 days.

(21) Appl. No.: 09/419,637

(22) Filed: Oct. 18, 1999

(30) Foreign Application Priority Data

Oct. 19, 1998 (JP) .................................................. 10-296987

(51) Int. Cl.[7] .............................. H03G 3/10; H03F 3/04; H03F 3/14
(52) U.S. Cl. ............................ 330/284; 330/302; 330/307
(58) Field of Search ..................................... 330/284, 302, 330/307

(56) References Cited

U.S. PATENT DOCUMENTS

| | | | |
|---|---|---|---|
| 3,729,687 | * 4/1973 | Orlandini et al. | 330/51 |
| 3,798,638 | * 3/1974 | Goldschmied | 330/59 |
| 4,316,103 | * 2/1982 | Nathanson | 307/304 |
| 5,121,075 | * 6/1992 | Roach | 330/284 |
| 5,661,438 | * 8/1997 | Sasaki | 330/284 |
| 5,999,056 | * 12/1999 | Fong | 330/278 |

* cited by examiner

Primary Examiner—Robert Pascal
Assistant Examiner—Patricia T. Nguyen
(74) Attorney, Agent, or Firm—Jones Volentine, PLLC (57) ABSTRACT

An input terminal of an amplifier circuit is connected to a base terminal of an amplifying transistor, and is also connected to one of the terminals of capacitor via a first wiring. An output terminal of the amplifier circuit is connected to a collector terminal of the amplifying transistor, to the other terminal of the capacitor via a second wiring and also to a source voltage via a load resistor. An emitter terminal of the amplifying transistor is connected to ground via a feedback resistor. The second wiring connecting the other terminal of the capacitor and the collector terminal of the amplifying transistor is formed to intersect a cutting line, or a so-called grid line, of the wafer which is used as reference for dicing the wafer into chips.

11 Claims, 8 Drawing Sheets

AMPLIFIER CIRCUIT

BACKGROUND OF THE INVENTION

The present invention relates to an amplifier circuit.

Figure 8:
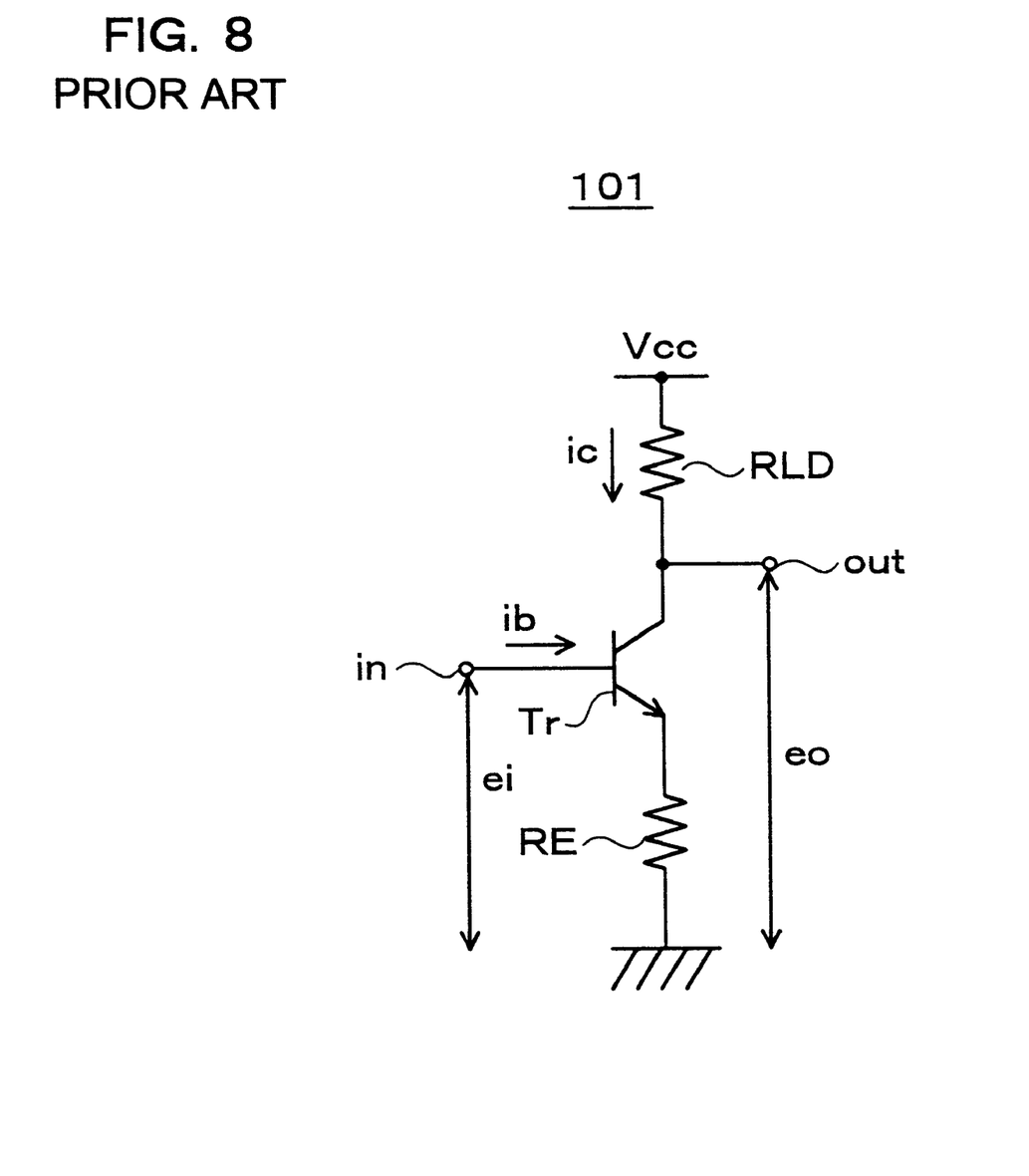
FIG. 8 is a circuit diagram of an amplifier circuit in the prior art.

A semiconductor integrated circuit (hereafter referred to as an IC) that processes analog signals is often provided with an amplifier circuit. Various types of amplifier circuits have been developed to meet requirements corresponding to different purposes of use, and among them, the grounded emitter-type amplifier circuit is one of those that can be achieved through the simplest circuit structure. FIG. 8 illustrates the grounded emitter-type amplifier circuit 101 in the prior art.

An input terminal "in" of the amplifier circuit 101 is connected to a base terminal of an amplifying transistor Tr. Its output terminal "out" is connected to both a collector terminal of the amplifying transistor Tr and the source Vcc via a load resistor RLD. An emitter terminal of the amplifying transistor Tr is connected to the ground GND via a feedback resistor RE.

The amplifier circuit 101 structured as described above multiplies a base current ib that is caused to flow into the base terminal by an input voltage ei by a factor of hfe (the current amplification factor of the amplifying transistor Tr) and supplies a collector current ic (=hfe×ib) to the collector terminal. In addition, it outputs an output voltage eo at a value achieved by subtracting the product of the collector current ic and the load resistance RLD from the voltage supplied by the source Vcc. It is to be noted that the feedback resistor RE fulfills a function of stabilizing the collector current ic when a load fluctuation occurs at a circuit connected to the output terminal "out" or when a fluctuation occurs in the ambient temperature.

Now, the IC manufacturing process includes an inspection step implemented to improve production throughput, to assure product reliability, to screen good/defective chip products and the like. During the inspection step, a probe test is normally conducted on ICs to measure their electrical characteristics. In this probe test, the electrical characteristics of the ICs are measured by placing probes on the bonding pads of a wafer where the ICs are formed.

However, during such a probe test on ICs, noise attributable to the parasitic capacity component present in the test apparatus and the like may enter the ICs. In particular, in an IC provided with an amplifier circuit such as the amplifier circuit 101, such noise may cause the amplifier circuit to oscillate. Such oscillation of the amplifier circuit, which constitutes an erroneous operation of the IC, often results in difficulty in obtaining accurate electrical characteristics of the IC having the amplifier circuit through a probe test.

SUMMARY OF THE INVENTION

An object of the present invention, which has been completed by addressing the problem of the prior art discussed above, is to provide an amplifier circuit that does not allow oscillation attributable to noise, i.e., that achieves an improvement in the noise-resisting characteristics.

In order to achieve the object described above, in a first aspect of the present invention, an amplifier circuit formed on a wafer is provided. This amplifier circuit is characterized in that it is provided with an amplifying transistor that outputs an amplified signal based upon an input signal, a gain control unit that is capable of lowering the gain of the amplifying transistor with respect to the input signal in a specific frequency band and a gain control unit switcher that is capable of switching the gain control unit to either an enabled state or a disabled state.

By adopting this structure, it becomes possible to set the gain of the amplifiying transistor to 0 dB or lower relative to the input signal having a frequency equal to or higher than a specific frequency level. For instance, even when a positive feedback occurs in the amplifying transistor due to high frequency external noise, it is possible to prevent oscillation of the amplifier circuit by setting the gain of the amplifying transistor at 0 dB. In addition, since the gain control unit that controls the gain of the amplifying transistor is switched to the enabled state or the disabled state by the gain control unit switcher, it is possible to reduce the gain of the amplifier circuit only during the period of time over which a positive feedback tends to occur, e.g., during the period of time over which a probe test is conducted on the amplifier circuit.

Furthermore, it is desirable to constitute the gain control unit as a capacitor having one of its terminals connected to a control terminal of the amplifying transistor and another terminal connected to the gain control unit switcher. By adopting this structure, the gain control unit is realized as a simple circuit.

The gain control unit switcher may be achieved in the form of a wiring. It is desirable to connect this wiring, which is preferably formed so that it can be cut when the wafer is diced into chips, to the other terminal of the capacitor at one end and to a first source terminal of the amplifying transistor at the other end. As explained earlier, oscillation may occur at the amplifier circuit during a probe test. Since the probe test is conducted before the wafer is made into chips through dicing under normal circumstances, the gain control for the amplifying transistor performed by the capacitor constituting the gain control unit is often not required after the wafer is cut into chips. According to the present invention, since the wiring constituting the gain control unit switcher is cut through dicing, the capacitor constituting the gain control unit is electrically cut off from the amplifying transistor. Thus, during a normal operation of the amplifier circuit after chip production, erroneous operation of the amplifier circuit such as a reduction in the gain of the amplifying transistor caused by the capacitor and the like are prevented.

Alternatively, the gain control unit switcher may be constituted of a wiring with one end of the wiring connected to the other terminal of the capacitor and the other end of the wiring connected to a pad. In this structure, the capacitor constituting the gain control unit can be set in an enabled state by inputting a specific voltage signal through the pad. As a result, the gain of the amplifying transistor can be reduced during a target period of time.

In addition, it is desirable to constitute the gain control unit as a capacitor having one of its terminals connected to a first source terminal of the amplifying transistor and another terminal connected to the gain control unit switcher. By adopting this structure, the gain control unit is realized as a simple circuit.

The gain control unit switcher may be achieved in the form of wiring. It is desirable to connect this wiring, which is preferably formed so that it can be cut when the wafer is diced into chips, to the other terminal of the capacitor at one end thereof and to a first source at the other end. As explained earlier, oscillation may occur at the amplifier circuit during a probe test. Since the probe test is conducted before the wafer is made into chips through dicing under normal circumstances, the gain control for the amplifying transistor performed by the capacitor constituting the gain control unit is often not required after the wafer is cut into chips. According to the present invention, since the wiring constituting the gain control unit switcher is cut through dicing, the capacitor constituting the gain control unit is electrically cut off from the first source and the capacitor is set in a disabled state. Thus, during a normal operation of the amplifier circuit after chip production, erroneous operation of the amplifier circuit such as a reduction in the gain of the amplifying transistor caused by the capacitor and the like are prevented.

Alternatively, the gain control unit switcher may be constituted of a wiring with one end of the wiring connected to the other terminal of the capacitor and the other end of the wiring connected to a pad. In this structure, the capacitor constituting the gain control unit can be set in an enabled state by connecting the pad to the first source. As a result, the gain of the amplifying transistor can be reduced during a target period of time.

Alternatively, the gain control unit switcher may be constituted with a switching transistor. A first source terminal and a second source terminal of this switching transistor are respectively connected to the first source and the other terminal of the capacitor. In this structure, by implementing on/off control of the switching transistor using a specific control signal, the capacitor constituting the gain control unit can be switched to an enabled state or a disabled state. As a result, it is possible to reduce the gain of the amplifying transistor over a target period of time. In addition, it is possible to implement batch control of a plurality of amplifier circuits with a specific control signal.

Also, in order to achieve the object described earlier, in a second aspect of the present invention, an amplifier circuit formed on a wafer is provided. This amplifier circuit is characterized in that it is provided with an amplifying transistor that outputs an amplified signal based upon an input signal, an input impedance control unit that is capable of reducing the input impedance of the amplifying transistor with respect to the input signal in a specific frequency band and an input impedance control unit switcher that is capable of switching the input impedance control unit to an enabled state or a disabled state.

By adopting this structure in which the input impedance of the amplifying transistor is reduced with respect to an input signal having a frequency equal to or higher than a specific frequency level, the degree to which high frequency noise affects the amplifier circuit can be reduced. In addition, since the input impedance control unit that controls the input impedance of the amplifying transistor is switched to the enabled state or the disabled state by the input impedance control unit switcher, it is possible to reduce the input impedance of the amplifier circuit only during the period of time over which high frequency noise tends to enter, e.g., during the period of time over which a probe test is conducted on the amplifier circuit.

In addition, it is desirable to constitute the input impedance control unit as a capacitor having one of its terminals connected to a control terminal of the amplifying transistor and another terminal connected to the input impedance control unit switcher. By adopting this structure, the input impedance control unit is realized as a simple circuit.

The input impedance control unit switcher may be achieved in the form of wiring. It is desirable to connect this wiring, which is preferably formed so that it can be cut when the wafer is diced into chips, to the other terminal of the capacitor at one end thereof and to a second source at the other end. As explained earlier, the amplifier circuit may be affected by high frequency noise during a probe test. Since the probe test is conducted before the wafer is cut into chips through dicing under normal circumstances, the input impedance control for the amplifying transistor performed by the capacitor constituting the input impedance control unit is often not required after the wafer is cut into chips. According to the present invention, since the wiring constituting the input impedance control unit switcher is cut through dicing, the capacitor constituting the input impedance control unit is electrically cut off from the second source and the capacitor is set in a disabled state. Thus, during a normal operation of the amplifier circuit after chip production, erroneous operation of the amplifier circuit such as a reduction in the impedance of the amplifying transistor caused by the capacitor and the like are prevented.

Alternatively, the input impedance control unit switcher may be constituted of a wiring with one end of the wiring connected to the other terminal of the capacitor and the other end of the wiring connected to a pad. In this structure, the capacitor constituting the input impedance control unit can be set in an enabled state by connecting the pad to the second source. As a result, the input impedance of the amplifying transistor can be reduced during a target period of time.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

DETAILED DESCRIPTION OF PREFERRED EMBODIMENTS

The following is a detailed explanation of the preferred embodiments of the amplifier circuit according to the present invention, given in reference to the attached drawings. It is to be noted that in the following explanation, the same reference numbers are signed to components having roughly the same functions and structural features to preclude the necessity for repeated explanation thereof.

(First Embodiment)

Figure 1:
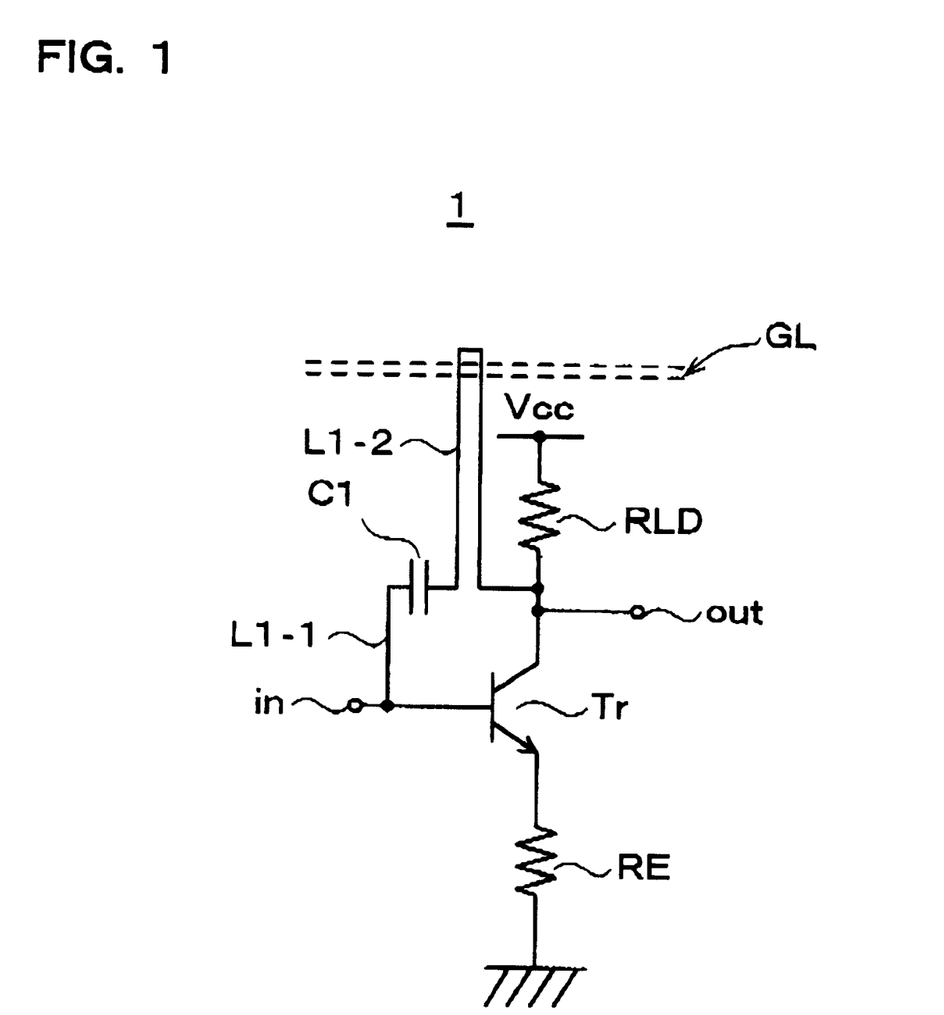
FIG. 1 is a circuit diagram of the amplifier circuit in a first embodiment of the present invention.

FIG. 1 shows an amplifier circuit 1 in the first embodiment of the present invention. This amplifier circuit 1 assumes a structure achieved by adding a capacitor C1, a first wiring L1-1 and a second wiring L1-2 to the structure of the amplifier circuit 101 in the prior art.

An input terminal "n" of the amplifier circuit 1 is connected to both a base terminal of an amplifying transistor Tr and one of the terminals of the capacitor C1 via the first wiring L1-1. Its output terminal "out" is connected to a collector terminal constituting a first source terminal of the amplifying transistor Tr, is connected to the other terminal of the capacitor C1 via the second wiring L1-2 and is also connected to the source Vcc constituting a first source via a load resistor RLD. An emitter terminal of the amplifying transistor Tr is connected to the ground GND constituting a second source via a feedback resistor RE.

The second wiring L1-2, which connects the other terminal of the capacitor C1 and the collector terminal of the amplifying transistor Tr is formed so that it intersects a cutting line which is used for reference when dicing the wafer into chips, i.e., a grid line GL.

Figure 2:
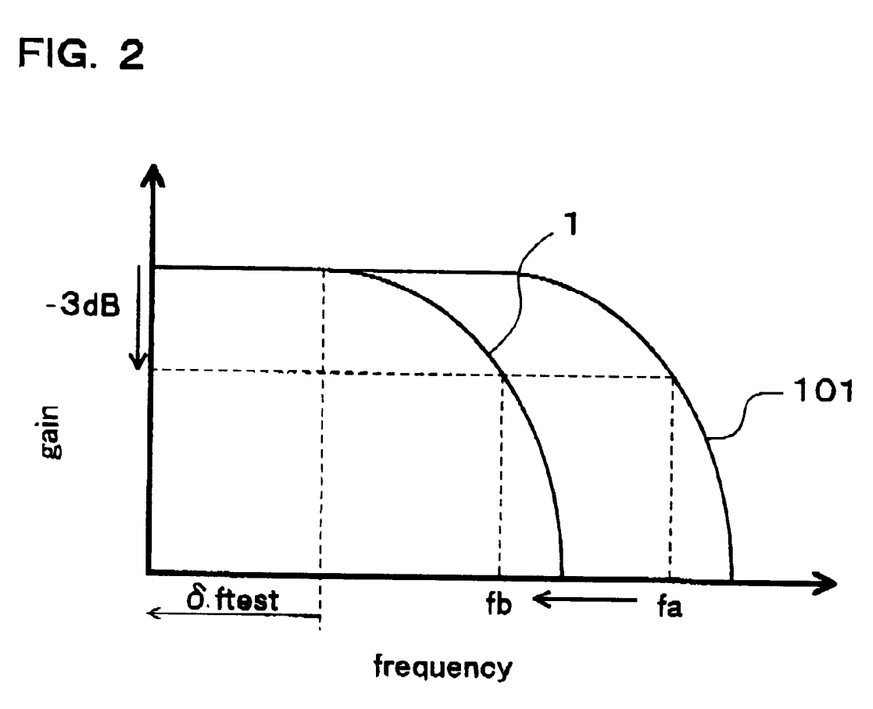
FIG. 2 is a waveform diagram illustrating the operations performed by the amplifier circuit shown in FIG. 1 and by an amplifier circuit in the prior art.

The operation performed by the amplifier circuit 1 in the first embodiment structured as described above and, the functions fulfilled therein are now explained in reference to FIG. 2.

The cut-off frequency (the frequency at which the current amplification factor hfe is lowered by 3 dB) fb of the amplifier circuit 1 in the first embodiment is shifted by the capacitor C1 toward the low frequency range relative to the cut-off frequency fa of the amplifier circuit 101 in the prior art. The cut-off frequency fb of the amplifier circuit 1 is set so that the current amplification factor hfe is maintained over the frequency band_ftest over which the probe test is conducted. In other words, the amplifier circuit 1 in the first embodiment is structured to actively reduce the gain in the range exceeding the frequency band_ftest.

Under normal circumstances, the feedback of an output signal toward the input side tends to occur more readily due to noise and the like in the high frequency range. In addition, if a signal phase inversion occurs in the feedback, the feedback becomes a positive feedback to cause oscillation of the amplifier circuit. However, the cut-off frequency fb of the amplifier circuit 1 in the first embodiment is set lower than the cut-off frequency fa of the amplifier circuit 101 in the prior art as illustrated in FIG. 2 so that the gain in the high frequency range is at 0 dB or lower. Consequently, even when a positive feedback occurs in the high frequency range, the amplifier circuit 1 in the first embodiment is prevented from oscillating. As a result, a probe test can be conducted on an IC provided with the amplifier circuit 1 in a stable manner to obtain accurate electrical characteristics of the IC.

In addition, the second wiring L1-2 connected to the capacitor C1 in the amplifier circuit 1 in the first embodiment is made to intersect the grid line GL. When such a structure is adopted, the second wiring L1-2 is cut during a dicing step implemented after the probe test. In other words, the capacitor C1 is set in an enabled state until the probe test is completed, and then it is disabled through the dicing of the wafer performed afterward. As explained above, the amplifier circuit 1 in the first embodiment, which is prevented from oscillating by the capacitor C1 during the probe test on the IC and achieves electrical equivalence to the amplifier circuit 101 in the prior art after the probe test with a specific current amplification factor hfe maintained through the high frequency range, is capable of supporting the operation of the IC in the high frequency range.

(Second Embodiment)

Figure 3:
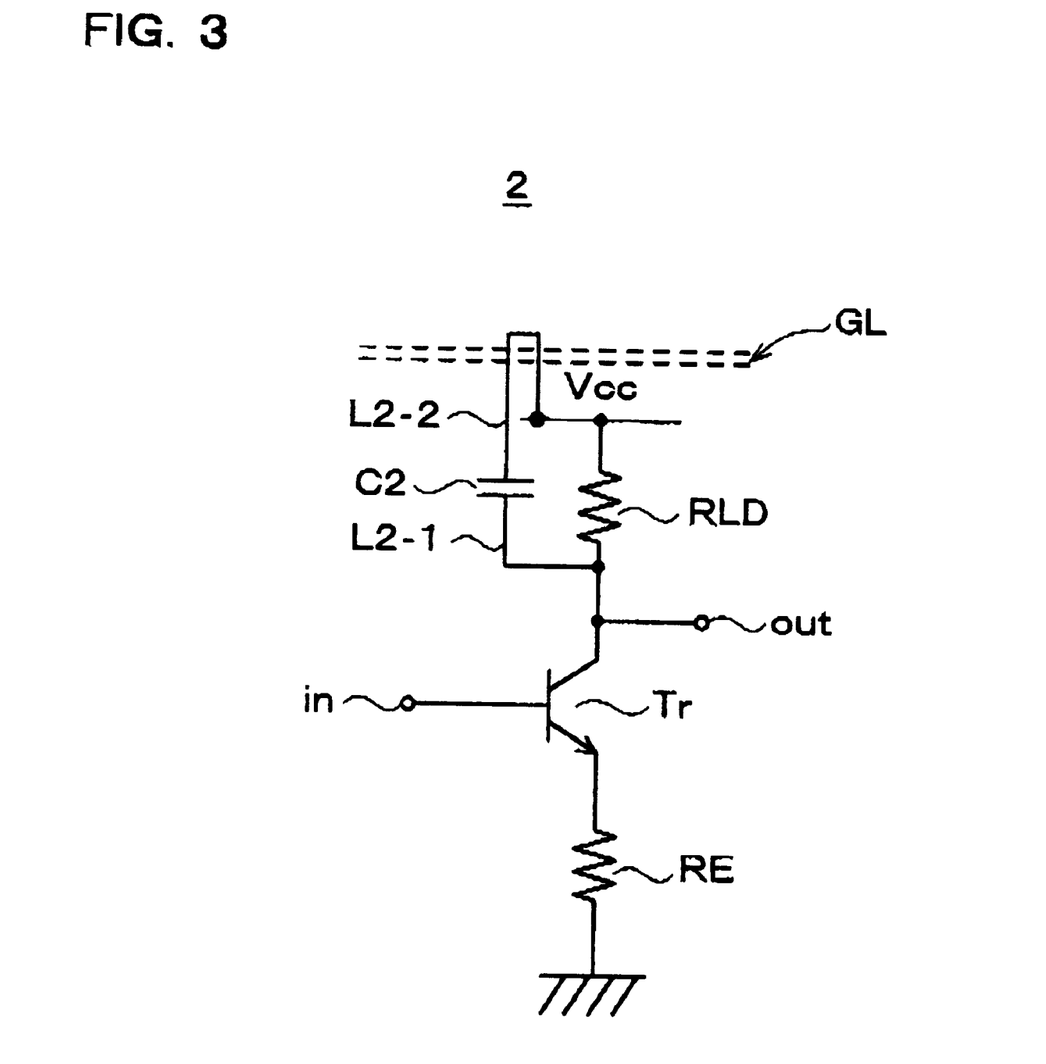
FIG. 3 is a circuit diagram of the amplifier circuit in a second embodiment of the present invention.

FIG. 3 shows an amplifier circuit 2 in the second embodiment of the present invention. This amplifier circuit 2 assumes a structure achieved by adding a capacitor C2, a first wiring L2-1 and a second wiring L2-2 to the structure of the amplifier circuit 101 in the prior art.

An input terminal "in" of the amplifier circuit 2 is connected to a base terminal of an amplifying transistor Tr. Its output terminal "out" is connected to a collector terminal of the amplifying transistor Tr, to one of the terminals of the capacitor C2 via the first wiring L2-1 and also to the source Vcc via a load resistor RLD. An emitter terminal of the amplifying transistor Tr is connected to the ground GND via a feedback resistor RE.

The second wiring L2-2, which connects the other terminal of the capacitor C2 and the source Vcc is formed so that it intersects the grid line GL.

The combined impedance constituted of the capacitor C2 and the load resistor RLD provided at the amplifier circuit 2 is lowered in the high frequency range, resulting in a great reduction in the gain of the amplifier circuit 2 in the band exceeding the frequency band$_{13}$ ftest.

Consequently, oscillation in the amplifier circuit 2 in the second embodiment is prevented as in the case of the amplifier circuit 1 in the first embodiment, even when a positive feedback occurs in the high frequency range. As a result, a probe test can be conducted on an IC provided with the amplifier circuit 2 in a stable manner to obtain accurate electrical characteristics of the IC.

In addition, the second wiring L2-2 connected to the capacitor C2 in the amplifier circuit 2 in the second embodiment is made to intersect the grid line GL. When such a structure is adopted, the second wiring L2-2 is cut during a dicing step implemented after the probe test. In other words, the capacitor C2 is set in an enabled state until the probe test is completed, and then it is disabled through the dicing of the wafer performed afterward. As explained above, the amplifier circuit 2 in the second embodiment, which is prevented from oscillating by the capacitor C2 during the probe test on the IC and achieves electrical equivalence to the amplifier circuit 101 in the prior art after the probe test by a specific current amplification factor hfe maintained through the high frequency range, is capable of supporting the operation of the IC in the high frequency range, as is the amplifier circuit 1 in the first embodiment.

(Third Embodiment)

Figure 4:
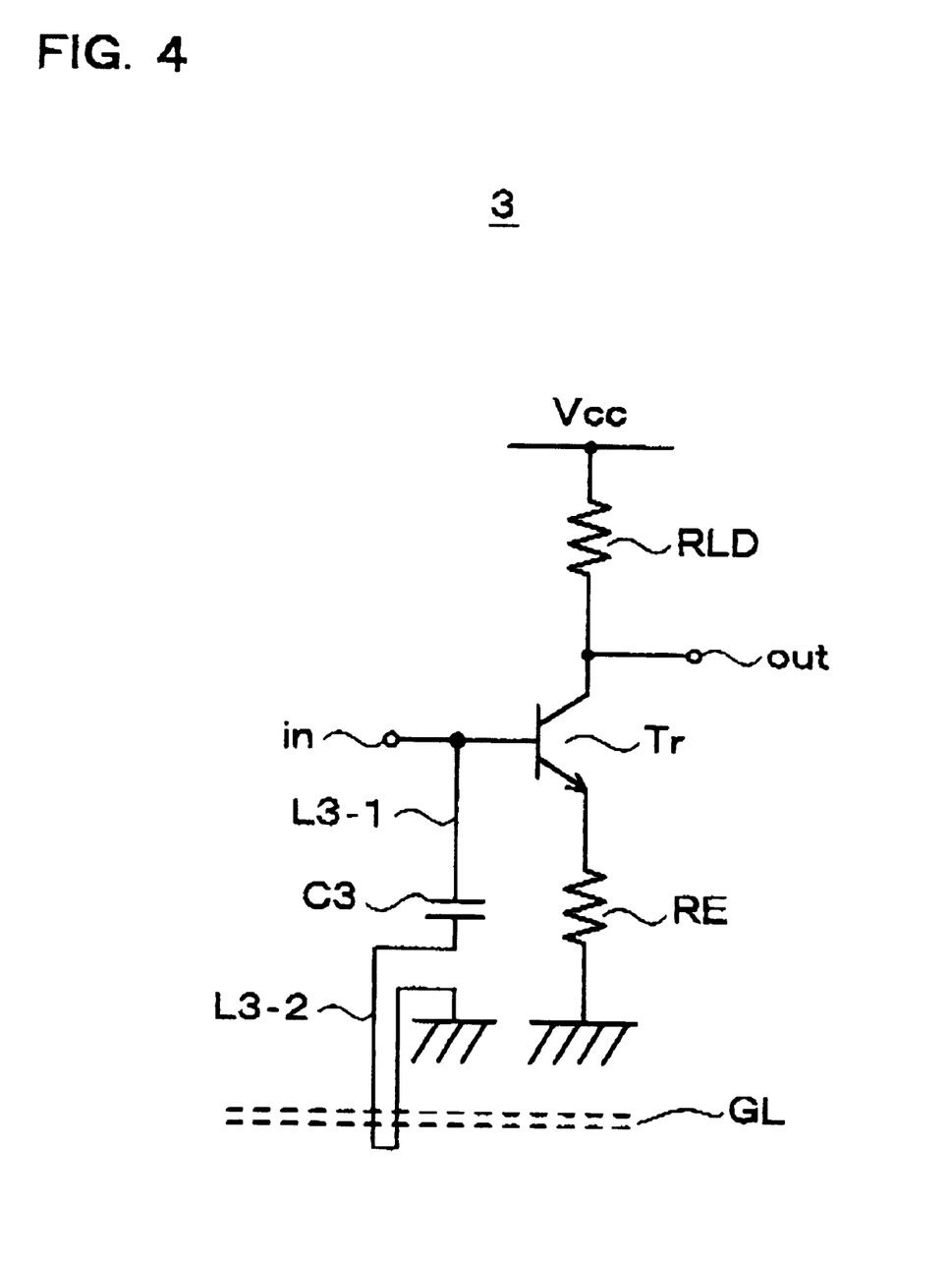
FIG. 4 is a circuit diagram of the amplifier circuit in a third embodiment of the present invention.

FIG. 4 shows an amplifier circuit 3 in the third embodiment of the present invention. This amplifier circuit 3 assumes a structure achieved by adding a capacitor C3, a first wiring L3-1 and a second wiring L3-2 to the structure of the amplifier circuit 101 in the prior art.

An input terminal "in" of the amplifier circuit 3 is connected to both a base terminal of an amplifying transistor Tr and one of the terminals of the capacitor C3 via the first wiring L3-1. Its output terminal "out" is connected to a collector terminal of the amplifying transistor Tr and is also connected to the source Vcc via a load resistor RLD. An emitter terminal of the amplifying transistor Tr is connected to the ground GND via a feedback resistor RE.

The second wiring L3-2, which connects the other terminal of the capacitor C3 and the ground GND is formed so that it intersects the grid line GL.

The capacitor C3 provided between a gate terminal of the amplifying transistor Tr and the ground GND normally functions to lower the input impedance of the amplifying transistor Tr which is set at a very high value in the high frequency band. Consequently, the amplifier circuit 3 in the third embodiment, in which very slight noise entering from the outside and high frequency noise are absorbed by the ground GND, makes it possible to conduct a probe test on an IC provided with the amplifier circuit 3 in a stable manner so that accurate electrical characteristics of the IC can be ultimately obtained.

In addition, the second wiring L3-2 connected to the capacitor C3 in the amplifier circuit 3 in the third embodiment is made to intersect the grid line GL. When such a structure is adopted, the second wiring L3-2 is cut during a dicing step implemented after the probe test. In other words, the capacitor C3 is set in an enabled state until the probe test is completed, and then it is disabled through the dicing of the wafer performed afterward. As explained above, the amplifier circuit 3 in the third embodiment makes it possible to suppress the effects of external noise and the like during an IC probe test, since the capacitor C3 adjusts the input impedance of the amplifying transistor Tr in the high frequency band to a low level during the probe test. Furthermore, as in the amplifier circuits 1 and 2 in the first and second embodiments, electrical equivalence to the amplifier circuit 101 in the prior art is achieved in the amplifier circuit 3 in the third embodiment after the probe test with the input impedance of the amplifying transistor Tr maintained at a high value in the high frequency band, thereby making it possible to support an IC operation in the high frequency band.

It is to be noted that the amplifier circuit 3 in the third embodiment may be utilized in combination with the amplifier circuit 1 in the first embodiment or the amplifier circuit 2 in the second embodiment. Namely, the capacitor C1 may be provided between the gate terminal and the collector terminal of the amplifying transistor Tr in the amplifier circuit 3, or the capacitor C2 may be provided between the collector terminal of the amplifying transistor Tr and the source Vcc. It is desirable to form the wiring connected to the capacitor C2 or C3 in such a manner that it intersects the grid line GL in this case. By adopting this structure, the capacitor C1 or C2 is enabled until the probe test is completed, as is the capacitor C3, and is then disabled through the dicing of the wafer.

(Fourth Embodiment)

Figure 5:
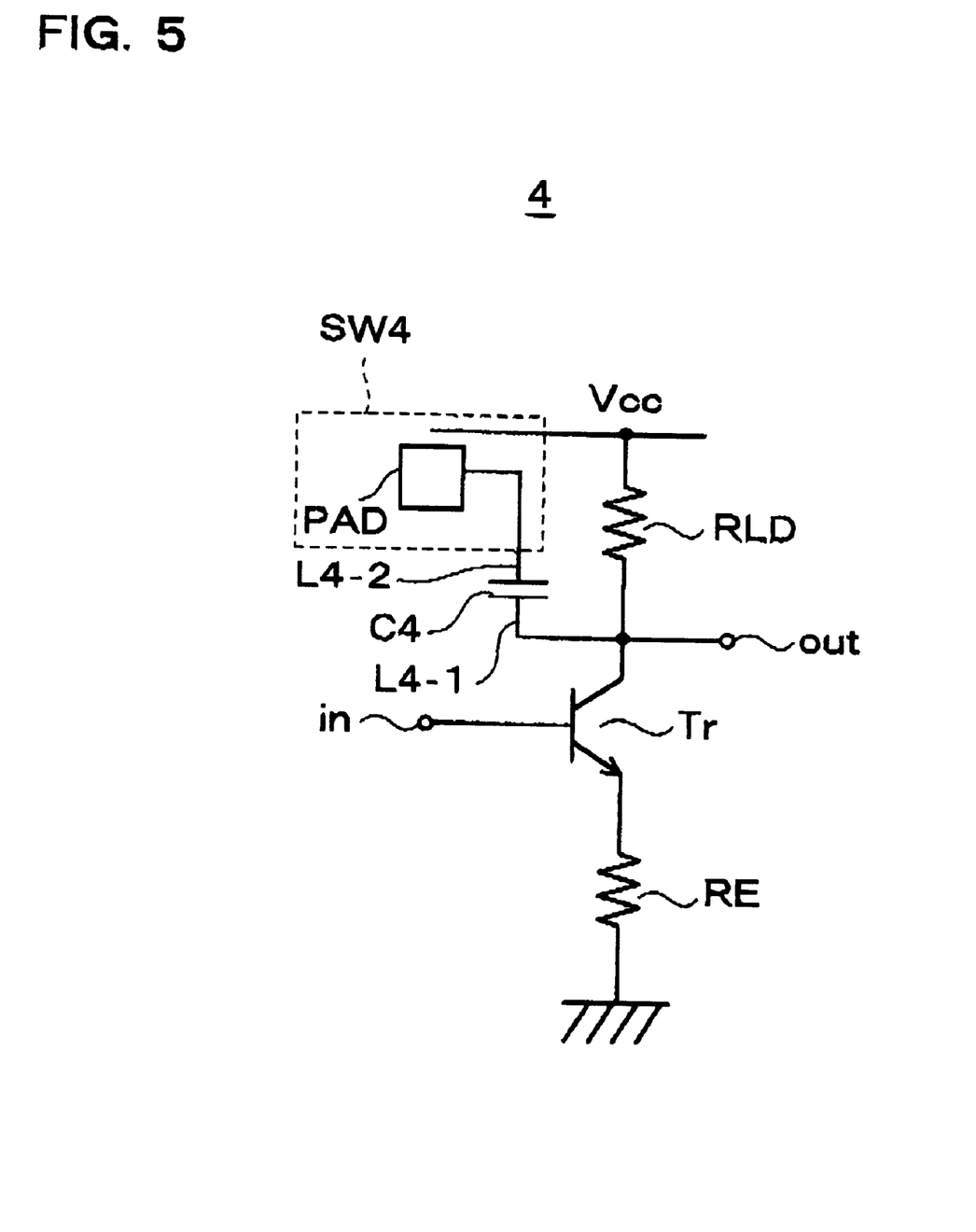
FIG. 5 is a circuit diagram of the amplifier circuit in a forth embodiment of the present invention.

FIG. 5 illustrates an amplifier circuit 4 in the fourth embodiment of the present invention. This amplifier circuit 4 assumes a structure achieved by adding a capacitor C4, a first wiring L4-1, a second wiring L4-2 and a switch SW4 to the structure of the amplifier circuit 101 in the prior art, with the switch SW4 constituted of a pad PAD.

An input terminal "in" of the amplifier circuit 4 is connected to a base terminal of an amplifying transistor Tr. Its output terminal "out" is connected to a collector terminal of the amplifying transistor Tr, is connected to one of the terminals of the capacitor C4 via the first wiring L4-1 and is also connected to the source Vcc via a load resistor RLD. An emitter terminal of the amplifying transistor Tr is connected to the ground GND via a feedback resistor RE.

the other terminal of the capacitor C4 is connected to the pad PAD provided at the switch SW4 via the second wiring L4-2.

Under normal circumstances, the pad PAD of the amplifier circuit 4 in the fourth embodiment is set in an open state, and in this state, the amplifier circuit 4 achieves electrical equivalence to the amplifier circuit 101 in the prior art.

When conducting a probe test on an IC provided with the amplifier circuit 4, the pad PAD and the source Vcc are shorted. This connects the other terminal of the capacitor C4 with the source Vcc.

The combined impedance constituted of the capacitor C4 and the load resistor RLD provided at the amplifier circuit 4 is lowered in the high frequency range, resulting in a great reduction in the gain of the amplifier circuit 4 in the band exceeding the frequency band_ftest. Consequently, oscillation amplifier circuit 4 in the fourth embodiment is prevented as in the case of the amplifier circuits 1 and 2 in the first and second embodiments even when a positive feedback occurs in the high frequency range. As a result, a probe test can be conducted on an IC provided with the amplifier circuit 4 in a stable manner to obtain accurate electrical characteristics of the IC.

In addition, the capacitor C4 provided at the amplifier circuit 4 in the fourth embodiment is enabled by electrically connecting the pad PAD to the source Vcc. In other words, the amplifier circuit 4 in the fourth embodiment makes it possible to conduct a probe test in a stable manner before the wafer is cut into chips through dicing as do the amplifier circuits 1, 2 and 3 in the first, second and third embodiments explained earlier, and also makes it possible to conduct a probe test in a stable manner over a specific period of time after the wafer is cut into chips.

(Fifth Embodiment)

Figure 6:
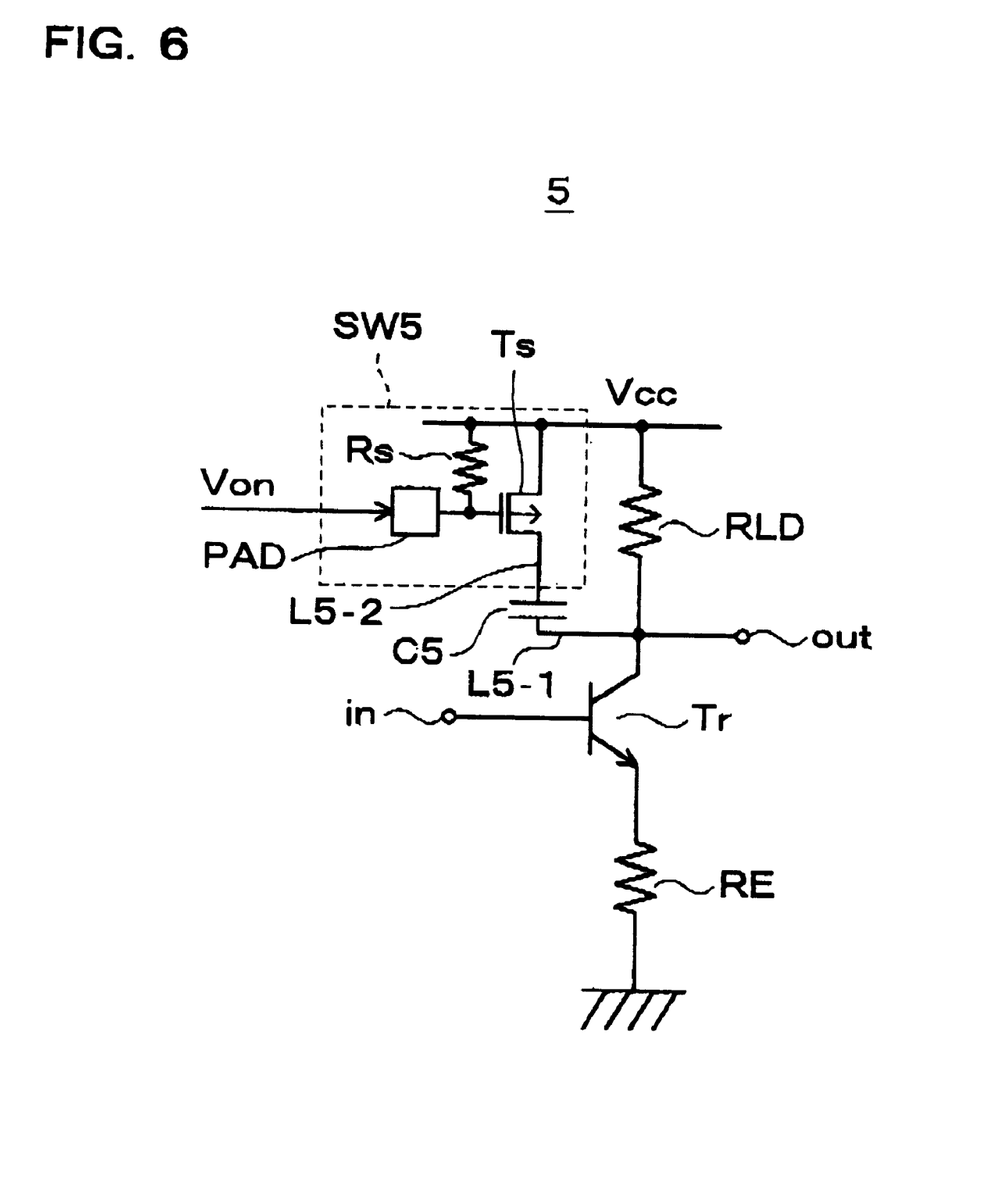
FIG. 6 is a circuit diagram of the amplifier circuit in a fifth embodiment of the present invention.

FIG. 6 illustrates an amplifier circuit 5 in the fifth embodiment of the present invention. This amplifier circuit 5 assumes a structure achieved by adding a capacitor C5, a first wiring L5-1, a second wiring L5-2 and a switch SW5 to the structure of the amplifier circuit 101 in the prior art, with the switch SW5 constituted of a pad PAD, a resistor Rs and a P-channel transistor Ts that functions as a switching transistor.

An input terminal "in" of the amplifier circuit 5 is connected to a base terminal of an amplifying transistor Tr. Its output terminal "out" is connected to a collector terminal of the amplifying transistor Tr, is connected to one of the terminals of the capacitor C5 via the first wiring L5-1 and is also connected to the source Vcc via a load resistor RLD. An emitter terminal of the amplifying transistor Tr is connected to the ground GND via a feedback resistor RE.

the other terminal of the capacitor C5 is connected to a drain terminal constituting a second source terminal of the P-channel transistor Ts provided at the switch SW5 via the second wiring L5-2. A gate terminal of the P-channel transistor Ts is connected to the pad PAD and one of the terminals of the resistor Rs. In addition, a source terminal constituting a first source terminal of the P-channel transistor Ts is connected to both the other terminal of the resistor Rs and the source Vcc.

The operation performed by the amplifier circuit 5 in the fifth embodiment structured as described above is now explained. When conducting a probe test on an IC that includes the amplifier circuit 5, a control voltage Von is applied to the pad PAD first. This sets the P-channel transistor Ts in an on state and the voltage of the source Vcc is applied to the other terminal of the capacitor C5. In other words, in the amplifier circuit 5 in the fifth embodiment, electrical equivalence to the amplifier circuits 2 and 4 in the second and fourth embodiments explained earlier is achieved by the control voltage Von applied to the pad PAD. Consequently, oscillation in the amplifier circuit 5 in the fifth embodiment is prevented as in the case of the amplifier circuits 2 and 4 in the second and fourth embodiments even when a positive feedback occurs in the high frequency range. As a result, a probe test can be conducted on an IC provided with the amplifier circuit 5 in a stable manner to obtain accurate electrical characteristics of the IC.

In addition, the capacitor C5 provided at the amplifier circuit 5 in the fifth embodiment is enabled by applying the control voltage Von to the pad PAD. In other words, the amplifier circuit 5 in the fifth embodiment makes it possible to conduct a probe test on an IC provided with the amplifier circuit 5 in a stable manner before the wafer is cut into chips through dicing as do the amplifier circuits 1, 2 and 3 in the first, second and third embodiments explained earlier, and also makes it possible to conduct a probe test in a stable manner over a specific period of time after the wafer is cut into chips, as does the amplifier circuit 4 in the fourth embodiment.

It is to be noted that in the amplifier circuit 5 in the fifth embodiment, which is provided with the P-channel transistor Ts between the capacitor C5 and the source Vcc, the utilization of such a FET (field effect transistor) makes it possible to constitute circuit systems that are independent from each other on the gate terminal side and the capacitor C5 side. In addition, since the amplifying transistor Tr constituting the amplifier circuit 5 is a bipolar transistor, a bipolar transistor may be employed in place of the P-channel transistor Ts to connect the capacitor C5 and the source Vcc to improve production efficiency.

Figure 7:
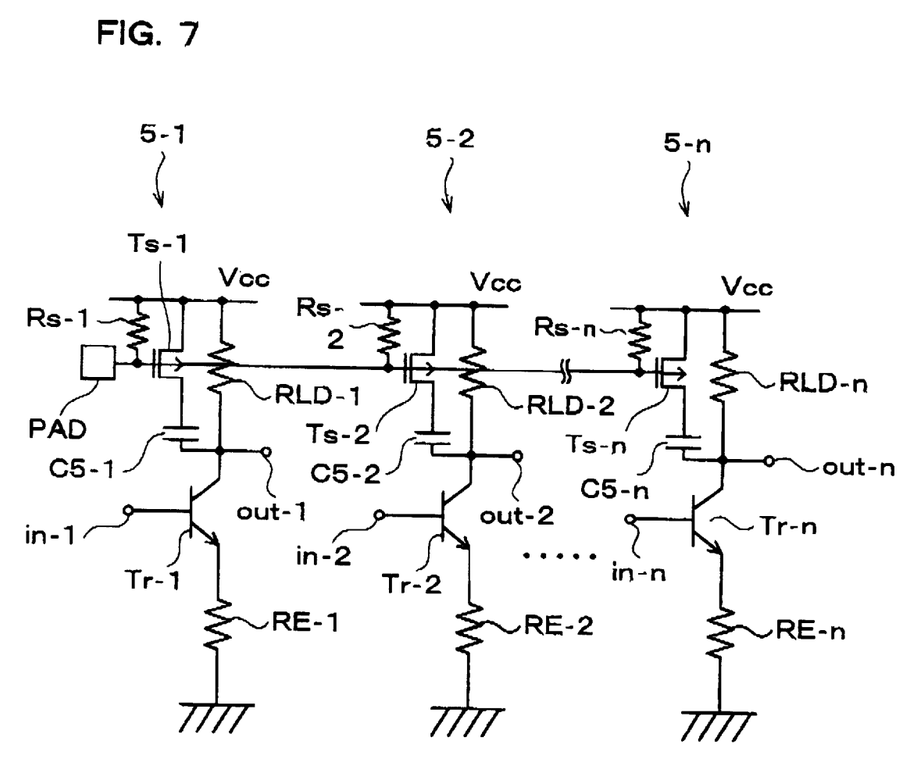
FIG. 7 is a circuit diagram illustrating a structure achieved by connecting the amplifier circuits, one of which is shown in FIG. 6, over a plurality of stages.

Now, as illustrated in FIG. 7, an IC may be provided with a plurality of amplifier circuits 5-1, 5-2, . . . , 5-n. In such a case, by adopting a circuit structure that is almost identical to that of the amplifier circuit 5 in the fifth embodiment in the individual amplifier circuits 5-1, 5-2, . . . , 5-n, the probe test can be conducted in a stable manner on the IC.

The following is an explanation of the structures and connections of the individual amplifier circuits 5-1, 5-2, . . . , 5-n, given in reference to FIG. 7.

An input terminal "in-1" of the amplifier circuit 5-1 is connected to a base terminal of an amplifying transistor Tr-1. Its output terminal "out-1" is connected to a collector terminal of the amplifying transistor Tr-1, is connected to one of the terminals of a capacitor C5-1 and is also connected to the source Vcc via a load resistor RLD-1. An emitter terminal of the amplifying transistor Tr-1 is connected to the ground GND via a feedback resistor RE-1. The other terminal of the capacitor C5-1 is connected to the drain terminal of a P-channel transistor Ts-1. The gate terminal of the P-channel transistor Ts-1 is connected to one of the terminals of a resistor Rs-1 and its source terminal is connected to the source Vcc together with the other terminal of the resistor Rs-1.

The amplifier circuits 5-2, . . . , 5-n each adopt a circuit structure almost identical to that of the amplifier circuit 5-1. An explanation is given on the amplifier circuit 5-n as an example. An input terminal "in-n" of the amplifier circuit 5-n is connected to a base terminal of an amplifying transistor Tr-n. Its output terminal "out-n" is connected to a collector terminal of the amplifying transistor Tr-n, is connected to one of the terminals of a capacitor C5-n and is also connected to the source Vcc via a load resistor RLD-n. An emitter terminal of the amplifying transistor Tr-1 is connected to the ground GND via a feedback resistor RE-n. The other terminal of the capacitor C5-n is connected to the drain terminal of a P-channel transistor Ts-n. The gate terminal of the P-channel transistor Ts-n is connected to one of the terminals of the resistor Rs-n and its source terminal is connected to the source Vcc together with the other terminal of the resistor Rs-n.

In addition, the gate terminals of the P-channel transistors Ts-1, Ts-2, . . . , Ts-n, respectively provided at the amplifier circuits 5-1, 5-2, . . . , 5-n are commonly connected to a pad PAD.

As explained above, the capacitor C5, the first wiring L5-1, the second wiring L5-2 and the switch sw5 which characterize the amplifier circuit 5 in the fifth embodiment may be adopted in an IC provided with a plurality of amplifier circuit 5-1, 5-2, . . . , 5-n. In such a structure in which the capacitors C5-1, C5-2, . . . , C5-n respectively provided at the amplifier circuits 5-1, 5-2, . . . , 5-n are enabled by applying the control voltage Von to the pad PAD, the individual amplifier circuits 5-1, 5-2, . . . , 5-n are prevented from oscillating even when a positive feedback occurs in the amplifier circuit 5-1, 5-2, . . . , 5-n. Thus, it becomes possible to conduct a probe test on the IC in a stable manner, and, as a result, accurate electrical characteristics of the IC can be obtained.

It is to be noted that in the amplifier circuit 5 in the fifth embodiment, the pad PAD may be eliminated with the gate terminal of the P-channel transistor Ts and one of the terminals of the resistor Rs connected to the ground GND through a wiring that intersects the grid line GL. This will achieve electrical equivalence to the amplifier circuit 101 in the prior art in the amplifier circuit 5 after the probe test on the IC provided with the amplifier circuit 5, as in the amplifier circuits 1, 2 and 3 in the first, second and third embodiments explained earlier, to make it possible to support an operation of the IC in the high frequency band.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the explanation is given on the embodiments above in which the amplifier circuits 1, 2, 3, 4 and 5 are each constituted of the grounded emitter-type amplifier circuit that employs an amplifying transistor Tr which is a bipolar transistor, the present invention is not restricted to this example and it may be adopted in various other types of amplifier circuits including a differential amplifier circuit and the grounded source-type amplifier circuit constituted of a CMOS transistor.

In addition, the amplifier circuits 4 and 5 in the fourth and fifth embodiments make it possible to obtain the electrical characteristics of an IC in a stable manner during a measurement on the IC mounted at a socket or an evaluation board or the like after the packaging process as well as in a probe test.

Furthermore, while the second wirings L1-2, L2-2 and L3-2 in the amplifier circuits 1, 2 and 3 in the first, second and third embodiments are each formed to intersect the grid line GL, the first wirings L1-1, L2-1 and L3-1 may be each formed to intersect the grid line GL instead. Moreover, both the first wirings L1-1, L2-1 and L3-1 and the second wirings L1-2, L2-2 and L3-2 may be formed to intersect the grid line GL. By adopting such a structure, the capacitors C1, C2 and C3 are set in a state of complete electrical isolation and, as a result, the capacitors C1, C2 and C3 do not affect the completed IC product in any way whatsoever.

As has been explained, since the gain of the amplifying transistor provided at the amplifier circuit can be reduced over specific period of time according to the present invention, it is possible to prevent oscillation of the amplifier circuit which may be otherwise caused by noise or the like.

In addition, since the effect of external noise on the amplifier circuit can be suppressed by reducing the input impedance of the amplifier circuit over a specific period of time according to the present invention, the amplifier circuit can be prevented from oscillating.

The entire disclosure of Japanese Patent Application No. 10-296987 filed on Oct. 19, 1998 including specification, claims, drawings and summary is incorporated herein by reference in its entirety.

What is claimed is:

1. An amplifier circuit formed on a wafer, comprising:
    an amplifying transistor that outputs an amplified signal based upon an input signal;

a gain control unit that is capable of reducing the gain of said amplifying transistor with respect to the input signal in a specific frequency band; and a gain control unit switcher that is capable of switching said gain control unit to an enabled state or a disabled state.

2. An amplifier circuit according to claim 1, wherein:

said gain control unit is constituted of a capacitor with one terminal thereof connected to a control terminal of said amplifying transistor and another terminal thereof connected to said gain control unit switcher.

3. An amplifier circuit according to claim 2, wherein:

said gain control unit switcher is constituted of a wiring formed to enable cutting through a dicing process in which said wafer is cut into chips, with one end thereof connected to said another terminal of said capacitor and another end thereof connected to a first source terminal of said amplifying transistor.

4. An amplifier circuit according to claim 2, wherein:

said gain control unit switcher is constituted of a wiring with one end thereof connected to said another terminal of said capacitor and another end thereof connected to a pad.

5. An amplifier circuit according to claim 1, wherein:

said gain control unit is constituted of a capacitor with one terminal thereof connected to a first source terminal of said amplifying transistor and another terminal thereof connected to said gain control unit switcher.

6. An amplifier circuit according to claim 5, wherein:

said gain control unit switcher is constituted of a wiring formed to enable cutting through a dicing process in which said wafer is cut into chips, with one end thereof connected to said other terminal of said capacitor and another end thereof connected to a first source.

7. An amplifier circuit according to claim 5, wherein:

said gain control unit switcher is constituted of a wiring with one end thereof connected to said another terminal of said capacitor and another end thereof connected to a pad.

8. An amplifier circuit according to claim 5, wherein:

said gain control unit switcher is constituted of a switching transistor provided with a first source terminal connected with said first source and a second source terminal connected with said another terminal of said capacitor. terminal of said capacitor.

9. An amplifier circuit formed on a wafer comprising:

an amplifying transistor that outputs an amplified signal based upon an input signal;

an input impedance control unit that is capable of reducing the input impedance of said amplifying transistor with respect to the input signal in a specific frequency band; and an input impedance control unit switcher that is capable of switching said input impedance control unit to an enabled state or a disabled state, said input impedance control unit is constituted of a capacitor with one terminal thereof connected to a control terminal of said amplifying transistor and another terminal thereof connected to said input impedance control unit switcher.

10. An amplifier circuit according to claim 9, wherein:

said input impedance control unit switcher is constituted of a wiring formed to enable cutting through a dicing process in which said wafer is cut into chips with one end thereof connected to said another terminal of said capacitor and another end thereof connected to a second source.

11. An amplifier circuit according to claim 9, wherein:

said input impedance control unit switcher is constituted of a wiring with one end thereof connected to said another terminal of said capacitor and another end thereof connected to a pad.

* * * * *